US006947496B2

(12) United States Patent
Ezquerra-Moreu et al.

(10) Patent No.: US 6,947,496 B2
(45) Date of Patent: Sep. 20, 2005

(54) METHOD FOR REFINING A DC-OFFSET ESTIMATE AND REMOVING THE DC-OFFSET

(76) Inventors: Angel Ezquerra-Moreu, 5240 Fiore Ter. #310, San Diego, CA (US) 92122; Pascal Audinot, 12 rue Henri Bosco, Valbonne (FR), 06560

(*) Notice: Subject to any disclaimer, the term of this patent is extended or adjusted under 35 U.S.C. 154(b) by 668 days.

(21) Appl. No.: 09/962,687

(22) Filed: Sep. 25, 2001

(65) Prior Publication Data

US 2003/0058965 A1 Mar. 27, 2003

(30) Foreign Application Priority Data

Oct. 30, 2000 (EP) .............................. 00403019

(51) Int. Cl.⁷ .................. H04L 25/06; H04L 25/10; H04B 15/00; H03D 1/24
(52) U.S. Cl. .................. 375/319; 375/285; 375/317
(58) Field of Search ................. 375/319, 317, 375/285, 320

(56) References Cited

U.S. PATENT DOCUMENTS

| | | | |
|---|---|---|---|
| 3,953,805 A | | 4/1976 | Couvillon |
| 4,091,453 A | * | 5/1978 | Martin ........................ 708/813 |
| 4,155,087 A | * | 5/1979 | Okrent ........................... 342/6 |
| 5,241,702 A | * | 8/1993 | Dent ........................ 455/278.1 |
| 5,422,889 A | | 6/1995 | Sevenhans et al. |
| 5,459,679 A | * | 10/1995 | Ziperovich ..................... 708/3 |
| 5,541,597 A | * | 7/1996 | Chi-Mao ..................... 341/118 |
| 5,579,347 A | | 11/1996 | Lindquist et al. |
| 5,760,629 A | * | 6/1998 | Urabe et al. ................. 327/307 |
| 5,793,817 A | * | 8/1998 | Wilson ....................... 375/297 |
| 5,838,735 A | | 11/1998 | Khullar |
| 2002/0029132 A1 | * | 3/2002 | Takahashi .................... 702/191 |
| 2002/0075013 A1 | * | 6/2002 | Schell ........................ 324/620 |
| 2002/0137487 A1 | * | 9/2002 | Yochem ...................... 455/303 |

FOREIGN PATENT DOCUMENTS

| | | | |
|---|---|---|---|
| EP | 0 594 694 A1 | 5/1994 | |
| EP | 0 594 894 B1 | 3/1999 | |
| GB | 2234187 A | * 1/1991 | ............. B01F/3/04 |

* cited by examiner

*Primary Examiner*—Stephen Chin
*Assistant Examiner*—Jia W. Lu
(74) *Attorney, Agent, or Firm*—Ronald O. Neerings; Wade James Brady, III; Frederick J. Telecky, Jr.

(57) ABSTRACT

A method for refining a DC-Offset estimate and removing of the DC-Offset includes the step of determining if any AM is present (602). If AM is determined to be present, it is next determined if the I and Q path DC-Offset estimates are closely matched, if they are, then only a single search using the average of the I and Q path estimates is used (608). If it determined however, that the two path estimates are not closely matched, than two searches are performed, one for each path (610). After this, the blocking signals are searched for up to a predetermined number and the DC-Offset vector is generated (612). Once the DC-Offset vector is generated, the DC-Offset is removed from the received signal (614). After which it is determined if the AM level is high (616), and if so, a transient correction routine is performed (618).

10 Claims, 4 Drawing Sheets

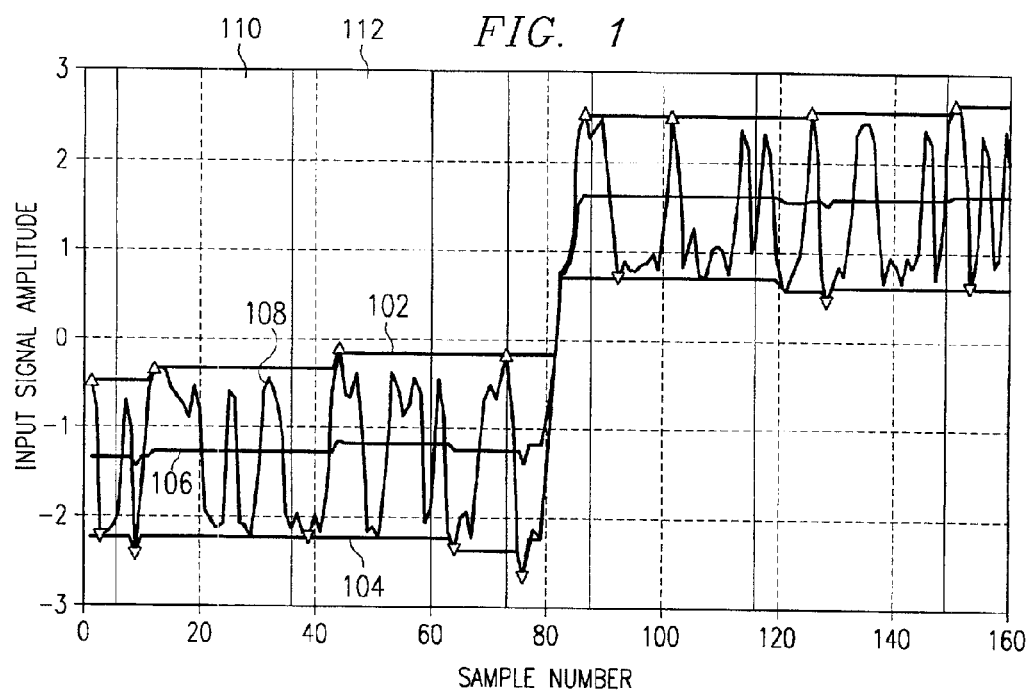
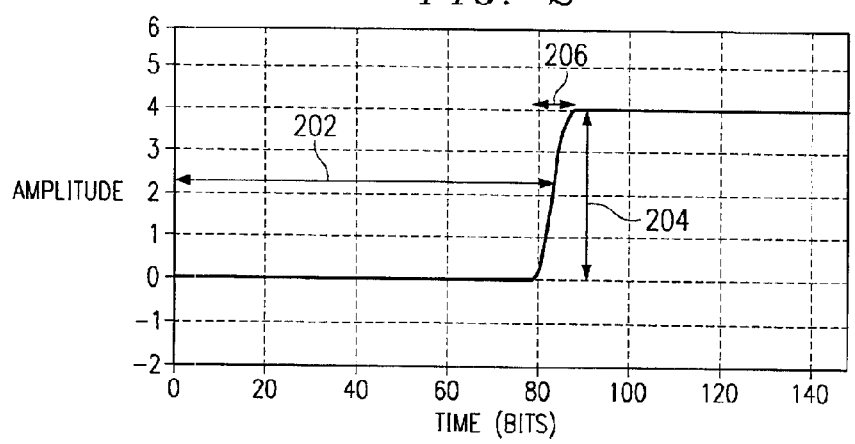

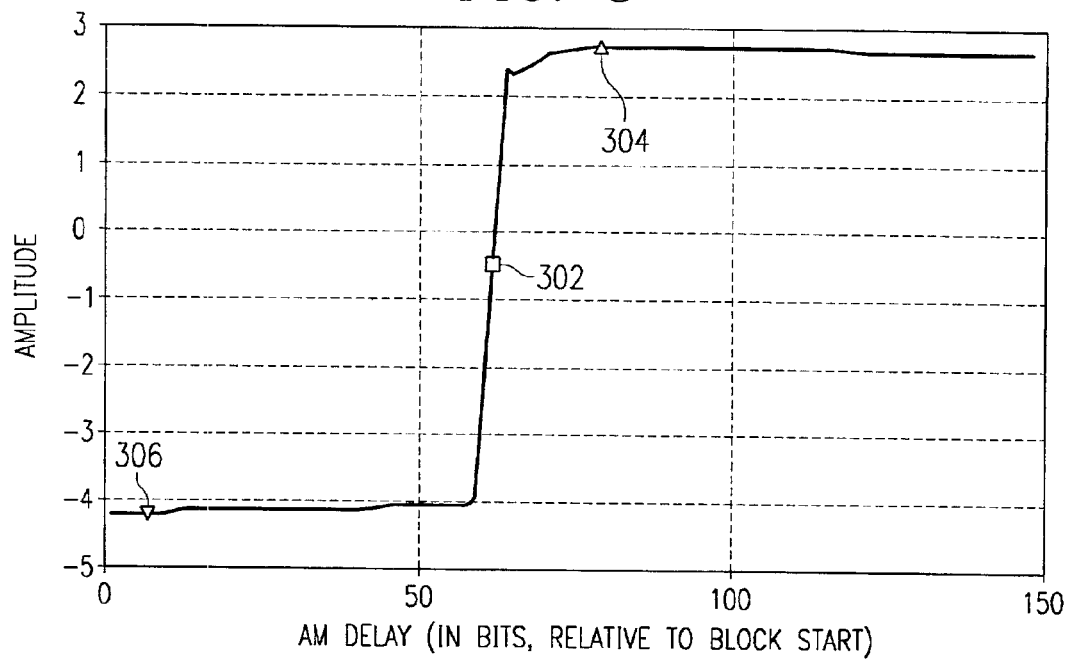
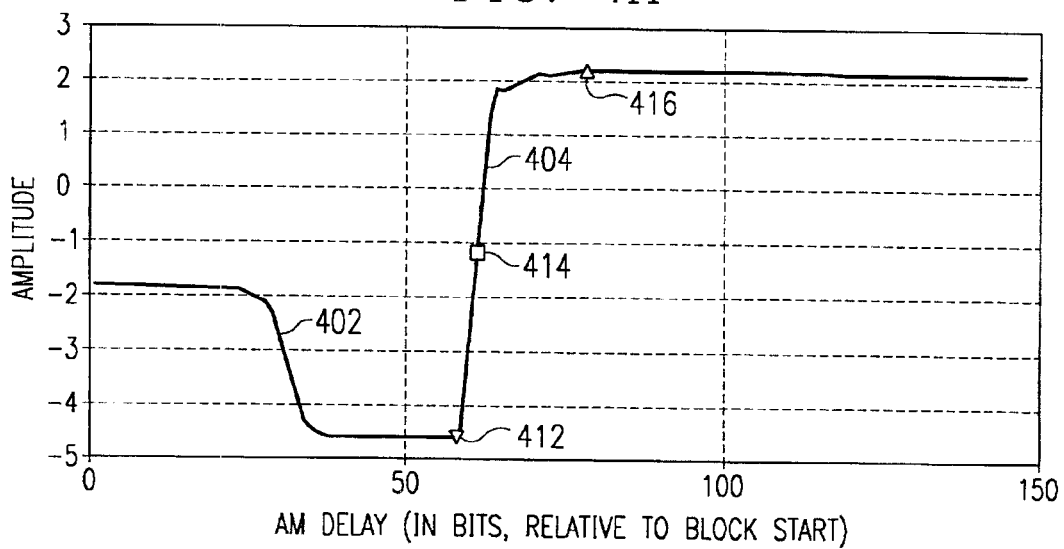

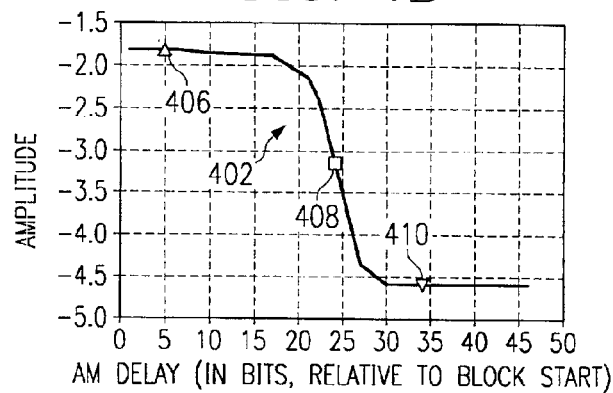
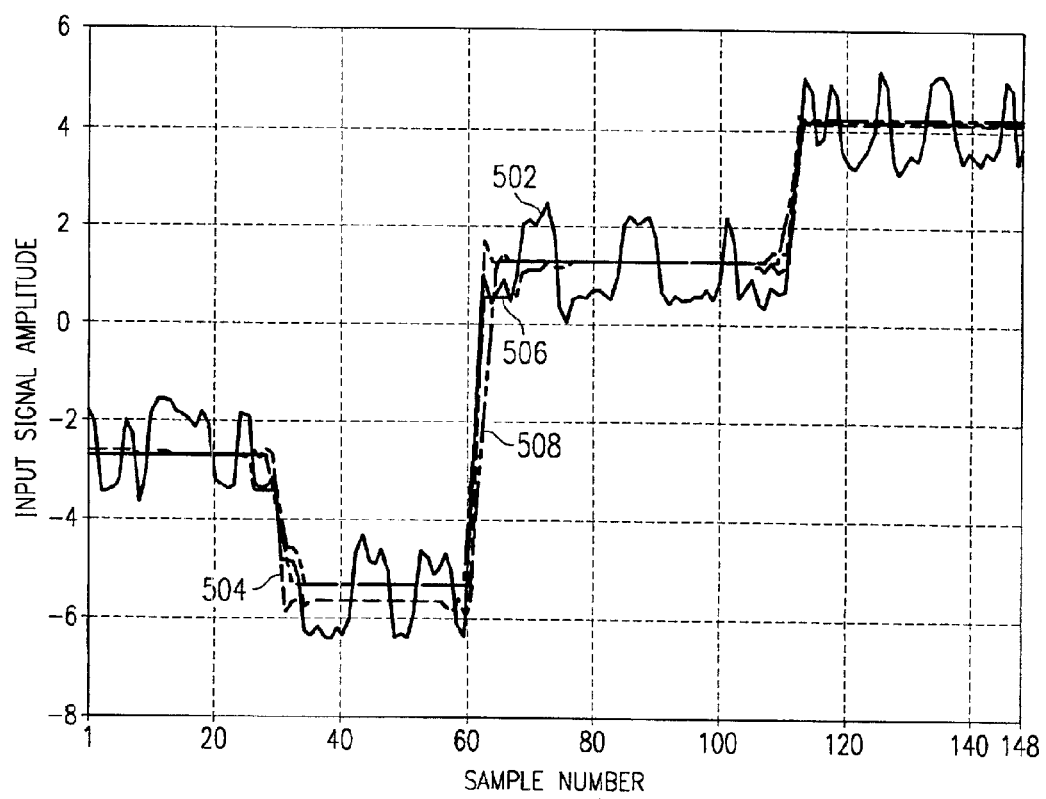

METHOD FOR REFINING A DC-OFFSET ESTIMATE AND REMOVING THE DC-OFFSET

This application claims priority, under 35 U.S.C. 119, to European Patent Application No. 00403019.3, filed Oct. 30, 2000.

TECHNICAL FIELD

This invention relates in general to the field of communications, and more specifically to a method of refining a DC-Offset estimate estimating and removing the DC-Offset.

BACKGROUND

Direct conversion architecture are very appealing to receiver designers because they require fewer components and therefore are less complex than traditional super-heterodyne receivers. Direct conversion receivers however suffer from a major problem, which is DC-Offset. Direct conversion receives take a radio frequency (RF) signal and translates it too base-band. So if there is any DC-Offset added to the received signal by the mixer (or any other component in the receiver), the DC component of the received signal will be lost because there is no intermediate frequency (IF) filter. Direct conversion receivers are very susceptible to the presence of blocking (interferer) signals that through self-mixing can produce a DC-Offset that is added to the received signal.

In the presence of a time varying DC-Offset, the receiver performance degrades with the amount of degradation depending on the DC-Offset variation and the speed of the variation. That is why solving for time-varying DC-Offset problems is one of the more critical problems to be resolved in a direct conversion receiver. One of the main reasons for the apparition of time-varying DC-Offsets in a direct conversion (also called homodyne) receivers is the presence of TDMA interferes, that through self-mixing or even order non-linearities, can produce a DC-Offset that is added to the received signal. This is something that does not happen with super-heterodyne receivers. Because such an interferer can appear at any time, the DC-Offset component that it will add to the received signal can also appear at any time. As a consequence, it is called a "time-varying" DC-Offset, because it will change depending on the arrival time of the interfering signal.

The DC-Offset problem worsens when the DC-Offset varies with time. Especially when under high AM suppression levels in non-static channel conditions. If one considers that more than one blocking signal can arrive during a single burst of a signal that is to be decoded, one can realize the complexity of the problem at hand. In a related application, entitled "Method for Estimating and Removing a Time-varying DC-Offset", applicants describe a method for estimating and removing a complex DC-Offset pattern. Although a very good estimate, which allows receivers to pass GSM's AM suppression test, a further improvement on such a DC-Offset estimate or other DC-Offset estimates using other techniques, would be welcome in the art, especially when dealing with multiple blocking signals.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

FIG. 1 shows the results of a first DC-Offset estimate.

FIG. 2 shows a typical DC-Offset profile highlighting AM Delay, AM level and transient length.

FIG. 3 shows AM delay search algorithm search results in accordance with the invention.

FIG. 4 shows the AM delay search results for a two blocking signal situation in accordance with the invention.

FIG. 5 shows the generation of a multiple DC-Offset path estimate generation in accordance with the invention.

DETAILED DESCRIPTION OF THE PREFERRED EMBODIMENT

Figure 6:
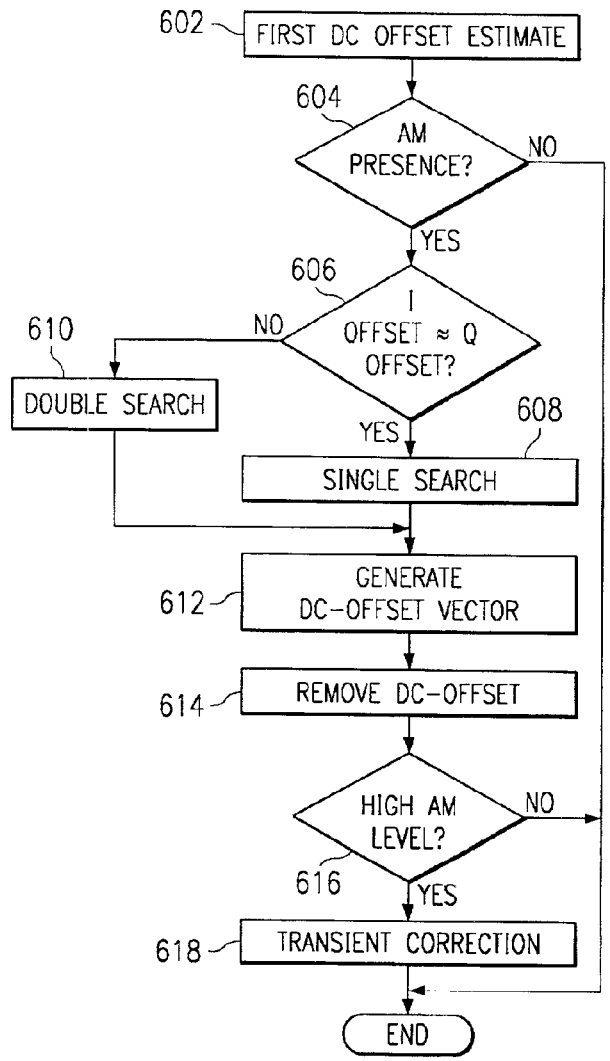
FIG. 6 shows a flowchart highlighting the steps taken in accordance with the invention.

While the specification concludes with claims defining the features of the invention that are regarded as novel, it is believed that the invention will be better understood from a consideration of the following description in conjunction with the drawing figures, in which like reference numerals are carried forward.

The preferred embodiment will be described in association with a TDMA system such as a GSM system, although the invention can be utilized with other communication systems. For the following method we suppose that the interfering signals that creates the DC-Offset has a constant envelope, but because it is "bursty" in nature it will produce changes on the DC-Offset, but between each DC-Offset change the dc-offset remains constant The method divides the incoming burst to which a DC-Offset has been introduced into two parts. Each part will have a different DC value, but the DC value will be constant within each of the parts (because the original signal was GMSK modulated). But between both parts there is a transient that typically has a cosinusodial profile 106 as shown in FIG. 1. The transient length depends on the maximum and minimum power ramp-up times specified in GSM 05.05, and can vary between 0 and 28 $\mu$s (8 bit periods) in a GSM system.

One purpose of the invention is to estimate the moment in which the DC-Offset changed because of the arrival of a blocking signal, and the value of the DC-Offset before and after that moment. This information will provide for a very accurate estimation of the offset path, especially when dealing with multiple blocking signals affecting the signal to be received.

If one considers that more than one blocking signal can arrive during a burst, the previous idea can be extended in the following manner. Instead of dividing the burst in two parts, it can be divided in a number of parts equal to the number of blocking signals plus one. Thus, the method will need to be able to find at which moment each of the blocking signals arrived, and the DC value between each pair of blocking signal arrivals. Using this simple idea the method of the present invention is able to accurately estimate, and therefore compensate for, very complex dynamic DC-Offset patterns.

The input that is acted upon by the present invention will be a first DC-Offset measurement that can be calculated using any one of a number of well-known DC-Offset estimation techniques. In the preferred embodiment, the DC-Offset estimation will be taken using the technique described in a related application filed by the applicants, entitled "Method for Estimating and Removing a Time-varying DC-Offset". This DC-Offset estimation technique estimates the lower and upper envelopes of the signal, and calculates the mean of those two envelopes. That mean is the first estimate of the DC-offset path.

In order to estimate the upper and lower envelopes, the following steps are taken:

1. Divide the burst 208 (shown in FIG. 2) into "N" blocks (210, 212, etc.) (if a constant block size is being used, divide into "N" block of Nsample/Nsamples); and
2. Calculate the maximum and the minimum samples within each block, and save their position and their value in two arrays, labeled, "vMax" and "vMin".

The objective of these first two substeps is to calculate a "pattern" which the envelopes follow (the envelopes must pass through the points in vMax and vMin). Once this is done the "instantaneous envelopes" are estimated using vMax and vMin as the starting points. This is done in the following manner:

3. For each pair of consecutive maximums from vMax the following is done:
   a). The smaller maximum, is referred to as max1, while the other, larger one is called max2;
   b). Define a value called "currentMax" and set it equal to max1; and
   c). For each sample between max1 and max2, starting at max1 and going towards max2, perform the following further steps:
      1. Compare each sample with the currentMax;
      2. If a sample is bigger than currentMax, set currentMax to the value of that sample; and
      3. Set the value of the instantaneous upper envelope (vInstMax) at that sample position equal to currentMax.
4) Repeat the same procedure for vMin:
   a). Name the larger minimum "min1", while the other, smaller one is called "min2";
   b). Define a value called "currentMin" and set it to "min1"; and
   c). For each sample between min1 and min2, starting at min1 and going towards min2:
      1. Compare each sample with currentMin;
      2. If a sample is smaller than currentMin, set currentMin to the value of that sample; and
      3. Set the value of the instantaneous lower envelope (vInstMin) at that sample position to currentMin.

As a result of the previous steps, and if the number of blocks (and therefore the block size) is chosen correctly, a very good estimation of the upper 202 and lower 204 envelopes can be determined as shown in FIG. 2. The estimated DC-Offset path 206 is also shown in FIG. 2 for one component of the signal (in-phase, I component). The DC-Offset path 206 is determined using the following equation:

$$VOffsetPath=(vInstMax+vInstMin)/2 \quad \text{Equation 1}$$

Time-Varying DC-Offset Detection

The method of the present invention starts by detecting if there is any DC-Offset within the burst. To do so, the power measure of the first estimate of the DC-Offset path as calculated using Equation 1, or any other DC-offset estimation technique known in the art, is computed, and if it is higher than a certain predetermined threshold, it is assumed that there is some dynamic DC-Offset within the burst. Only in this case will the DC-Offset compensation process continue.

This is a very important step, because it will be key to reduce the impact of the execution of this method on the sensitivity (noise) performance of the whole receiver chain. If the threshold is too high, the correction algorithm will work even when no AM suppression is present. If the noise is too high, the first offset path estimate as calculated by equation 1 will contain some peaks that could be interpreted by the current method as a change in the DC-Offset caused by an non-existent blocking signal. This can also happen for some particular channel profiles like GSM's HT100 and EQ100. In particular, the EQ100 is very sensible to this threshold. However, the present method has as a goal to introduce the least amount of degradation possible to the sensitivity performance of the receiver while maintaining good AM suppression performance.

The power measure used in the preferred embodiment is simple, and can be shown by Equation 2.

$$\text{power\_measure}=\Sigma abs(vOffsetPath-mean(vOffsetPath)) \quad \text{Equation 2}$$

Equation 2 is not a real measure of power, because instead of a power of two, it uses the absolute (abs) value. This however reduces the complexity of this step, while being equally useful and according to simulations conducted, equally accurate. Equation 2 is not only used to decide if there is any blocking signal. It is also used to decide how many blocking signals there are. The higher the power measure, the more blocking signals that will be searched for. In the preferred embodiment, up to three blocking signals are preferably searched for. Trying to detect more blocking signals may severely reduce the performance of the algorithm, because the burst would be divided into very small blocks, making the estimation of the DC level within each block too inaccurate.

AM Delay Search

If there is some DC-Offset, the arrival time of the blocking signal is estimated, which will be referred to as the "AM delay". The AM delay is shown by line 202 in FIG. 2, while the AM level is shown by line 204. The transient length of the blocking signal is shown by line 206. The transient length depends on the maximum and minimum power ramp-up times specified in GSM 05.05, and can vary between 0 and 28 $\mu s$ (8 bit periods).

Although the first offset path estimate using equation 1 is usually quite close to the real offset path, it is preferable to filter it a bit before starting the search. To do so two things can be done:

1) if the $1^{st}$ DC-Offset Path estimation is similar for both signal components (I and Q), their average could be calculated, and used for the search. This would reduce by two the number of operations required by the algorithm.
2) Otherwise the DC-Offset Path of each component (I and Q) could be filtered (e.g., with a sliding averaging window of size 5) and the search algorithm applied to each filtered offset path separately.

The first option above is based on the idea that although the DC-Offset level can be different in each component (I and Q), it will change at the same time, because the blocking signal affects both paths simultaneously (although in a different manner). Simulations have shown that when the DC-Offset levels in both the I and Q paths are similar, the search algorithm performance is greatly enhanced by averaging searching on the average of both estimated offset paths. This has also the benefit what there is only a need to search once, reducing the complexity of the overall algorithm.

To decide if the $1^{st}$ Offset Path estimations are close between both the I and Q components, the difference between the maximum and the minimum vMax values returned by the InstEnvelope algorithm applied to the I and Q components is compared. If the difference is similar (has the same "sign" and level), step (1) above will be executed. Otherwise step (2) will be carried out. Other techniques for comparing how similar the I and Q paths are to each other can also be used. For example, the difference between the maximum and minimum values of the first DC-offset estimate on a block by block basis can be compared between the I and Q paths. If the differences on a block by block basis for the I and Q are within a certain threshold of each other, then step (1) is performed, otherwise step (2) is performed.

In any case, the search algorithm itself is identical and iterative. It will try to find up to maxAM blocking signals (maxAM has been set to 3 in the preferred embodiment) and consists of the following four steps:

3) Calculate the maximum and minimum values of the filtered offset path.
4) Calculate the mean of both.
5) Search the filtered offset path sample whose position is between the positions of the maximum and the minimum samples and whose value is closer to that mean.
6) Compare the selected sample value with the mean value. If they are close (less than a third of the maximum-minimum difference) we consider that we found the arrival time of a blocking signal. Otherwise two things can happen:
   a) If the maximum and minimum values are close enough (e.g., within 10 samples), differentiate and search for the highest difference, which will indicate the blocking signal arrival time.
   b) If they are not close enough, it is inferred that there is no AM suppression within them, so that no AM delay was found.

Steps 3–6 are shown in FIG. 3, with the maximum value shown at point 304, the minimum value at point 306 and the mean value at point 302. If there is more than one blocking signal to be found, the above 4 steps are repeated in an iterative way, until as many blocking signals have been found up to a predefined limit (e.g., maxAM blocking signals). To do so, the burst is divided in two parts or blocks, one for each side of the estimated AM delay, respecting a small margin between the AM delay and the beginning of each block. The previous process is repeated for each of these two blocks. This is shown by FIG. 4, in which a burst with two 402 and 404 DC-Offset level changes is analyzed by the algorithm. The first DC-Offset level change 402 has a high value at point 406, a mean value at point 408 and a low value at point 410. While the second DC-Offset level change 404, has a high value at point 416, a mean value at point 414 and a low value at point 412.

The above process can be repeated until there are no more DC-Offset changes, or until the maximum allowed number of DC-Offset changes (e.g., maxAM threshold value set to three) has been reached. After the search is finished, and before the algorithm continues, a check is done for unreliable AM delays. Unreliable AM delays are those which are contiguous, very close and have the same "sign" (i.e., both imply an increase or a decrease of the offset level). When this happens, it is quite possible that the search algorithm divided a single DC-Offset change into two smaller and very close offset changes. As such these contiguous situations are searched for, and if found, a single AM delay is recalculated (by differentiation) which will substitute the two offending AM delays.

DC-Offset Path Generation

When all the AM delays have been found, the final estimation of the offset path is constructed using that information. That final estimation is then subtracted to the received signal samples in order to remove the dynamic DC-Offset. To construct that final estimation the following is done:

1) Between each AM delay the DC-Offset is considered constant, and equal to the mean of the first estimate of the offset path between the each pair of AM delay values. One must be careful to introduce a small margin to exclude the transient from the mean calculation.

2) The transitions between those values last 3 bits, which are linearly interpolated from the estimated offset values. Other "transient profiles" like "cosinus" and "square cosinus" where tested, but their performance was similar (if not slightly worse) while requiring more operations to be calculated.

In FIG. 5 there is shown a multiple offset path estimation generation using the estimation refinement technique of the method of the present invention. Line 502 shows the signal burst, line 504 shows the real offset, line 506 shows the first DC-Offset estimation using equation 1, while line 508 shows the DC-Offset refinement using the method of the present invention.

DC-Offset Correction

This portion is broken down into two parts, offset removal and transient correction. The offset removal section is the most straightforward step. It simply consists of subtracting the estimated offset value to its corresponding received sample, assuming a DSP is being used. Transient correction is the last step of the offset correction process. It consists of checking if there are any AM delays whose offset change is higher than a certain threshold, for example, 6. For each AM delay found, their corresponding samples along with the two closest samples are set to zero. The purpose of this last step is to reduce the impact of the unknown transient profile and length, which becomes critical when the DC-Offset change becomes higher.

A transient that precedes a DC-Offset change will not always be the same. Its duration can change because the GSM standard only specifies the maximum power ramp-up and power ramp-down duration (28 $\mu$s, i.e. around 8 bit periods). So a blocking signal can ramp-up (or ramp-down) in up to 8 bit periods. The actual ramp-up time will depend on the exact power ramp-up of the interfering device. In consequence there is no optimal transient length, and a trade off must be done. After several computer simulations, it was found out that the best trade off was offered when a transient length of 3 bits is used for the compensation. Nevertheless, when the interfering transient length is very short or, specially, very long, the performance may degrade.

When the interfering signal's ramp-up is very short, the following worst case scenario can happen. The algorithm can make a small mistake on the AM delay estimation. For example, it may estimate that the AM delay is 67, instead of the actual 68. In that case, because the ramp-up is very fast, one sample could be totally wrong. In that case, the Channel Impulse Response could fail, producing a big increase of the bit-error rate (BER).

On the other hand, when the ramp-up is very long (around 8 bits), if the AM delay estimation algorithm was off by one single bit, the error would be small, because the difference between the real sample value and the corrected value would be small. However, when the ramp-up is slow, the algorithm estimation variance is higher, and therefore the estimation method is more likely to be off by more than one bit. In that case the bits around the estimated AM delay will be probably wrong as well.

To solve these two problems, a simple solution exists. The solution is to set to zero some of the samples around the estimated position of the blocking signal. Because the equalizer treats the input samples as soft decisions, doing so is like telling the equalizer that those samples are unreliable, and should be treated as such. In practice it was found that setting 3 samples to zero (the estimated AM delay bit plus one bit on each side) gives the best performance increase. Setting more bits to zero would increase the BER, because when a sample is equal to zero, the equalizer and the encoder have to guess its real value, and this is not a perfect process.

This is done when the DC-Offset variation is large enough. When it is not, the BER increase caused by the AM delay estimation error will be very low. Only when the DC-Offset change becomes higher can the transient correction step provide a meaningful benefit. So the algorithm uses the DC-Offset change estimation in order to decide if it needs to set some samples to zero.

In FIG. 6, there is shown a flowchart highlighting the steps taken in accordance with the preferred embodiment. In step 602, a first estimate of the DC-Offset is calculated. In the preferred embodiment this is done using Equation 1. Once the DC-Offset has been estimated, in step 604 it is determined if AM is present using the power measurement of Equation 2. If it is determined that no AM is present, the routine ends. If however it is determined that AM is present, the routine moves on to step 606. In step 606 it is determined if the I and Q paths have similar DC-Offset path estimations. If the estimations for both paths are close enough, a single search is conducted for both paths in step 608. If it is determined that the estimations for the I and Q paths are not close to each other, than in step 610, a search for each path is done (double search).

In step 612, the refined DC-Offset vector is generated using the technique previously described. In step 614, the refined DC-Offset vector is subtracted from the wanted signal. It is determined in step 616 if the AM level is high, if it is not, the routine exits, if however, it is determined that the AM level is high, the routine moves to step 618. In step 618, transient correction is performed as explained previously.

Figure 7:
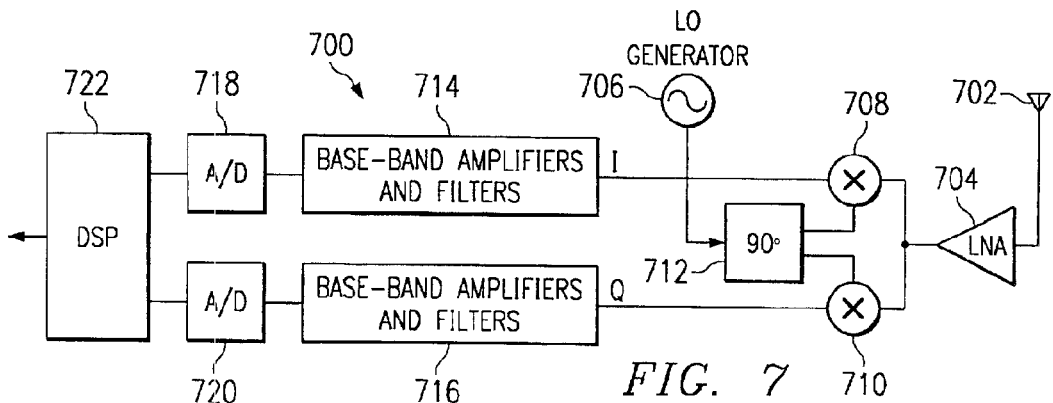
FIG. 7 shows a simplified block diagram of a receiver in accordance with the invention.

In FIG. 7, there is shown a simplified block diagram of a radio receiver that can implement the present invention. Receiver 700 includes an antenna 702 for receiving a RF signal and received RF signal is preferably band pass filtered (filter not shown) and then low noise amplifier 704 amplifies the filtered signal. The filtered signal is then down-converted to base band in an in-phase (I) and a quadrature phase (Q) channel by mixers 708 and 110. A local oscillator signal (LO) is provided by LO generator 706.

The LO signal form generator 706 is provided to a divider and phase shifter 712. The outputs of the divider and phase shifter 712 are feed to mixers 708 and 710. The I and Q signals produced by mixers 708 and 710 are filtered and amplified by base band amplifier and filter blocks 714 and 716. The amplified signals are then sent to analog-to-digital (A/D) converters 718 and 720 for conversion into digital signals and the digital signals are provided to a controller such as a digital signal processor (DSP) 722. In accordance with the preferred embodiment, the DSP 722 carries out the task of executing the algorithm to implement the offset path refinement estimation and DC-Offset removal of the present invention. It is worth noting that although a DSP has been used to perform the estimation and removal steps given its usefulness in performing such steps, other well known hardware circuits or devices can perform the required tasks.

In conclusion, the DC-Offset estimation refinement steps of the present invention provide for improved AM suppression, while minimizing any sensitivity performance for the receiver. Sensitivity performance tests show that DC-Offset estimation algorithm of the present invention had negligible impact on the receiver's sensitivity for all GSM channel profiles (ST, TU3, TU50, HT100, RA250). Complexity of the overall steps is in the order of 1.8 million instruction per-second (MIPS) when the algorithm is executed by a DSP. As shown, the method provides for the ability to compensate for multiple AM suppression.

While the preferred embodiments of the invention have been illustrated and described, it will be clear that the invention is not so limited. As previously mentioned the present invention can not only be used in GSM systems but also other constant envelope signals from other systems. Numerous modifications, changes, variations, substitutions and equivalents will occur to those skilled in the art without departing from the spirit and scope of the present invention as defined by the appended claims.

What is claimed is:

1. A method for refining a DC-offset estimate derived from a signal, the method characterized by the steps of:
    (a) detecting if there is any DC-Offset within the signal by taking a power measure of the DC-offset estimate;
    (b) estimating the arrival time (position) of at least one blocking signal affecting the signal by searching for level changes in the DC-offset estimate; and
    (c) generating a refined DC-offset estimate using the information gathered in step (b).

2. A method as defined in claim 1, wherein the power measure of the DC=offset estimate (vOffsetPath) is taken using the formula:

$$\text{power\_measure} = \Sigma \text{abs}(\text{vOffsetPath} - \text{mean}(\text{vOffsetPath})).$$

3. A method as defined in claim 1, comprising the further step of:
    (d) using the refined DC-offset estimate in order to remove the DC-offset from the signal.

4. A method as defined in claims 1, 2 or 3, wherein step (b) is performed using the following substeps:
    (b1) calculating the maximum and minimum values of the offset path;
    (b2) calculating the mean value of the maximum and minimum values of the offset path; and
    (b3) comparing selected sample values with the mean value calculated in step (b2), and if they are within a predetermined level then it indicates the arrival time of the blocking signal.

5. A method as defined in claim 4, wherein if in step (b3) the selected sample values and the mean value are not within the predetermined threshold level apart, but if the maximum and minimum values are close enough to each other, then the following further step is performed:
    (b4) differentiate an search for the highest difference, which will indicate the blocking signal arrival time.

6. A method as defined in claim 3, comprising the further step of:
    (e) performing a transient correction if the DC-Offset is large.

7. A method as defined in claim 6, wherein the transient correction in step (e) is performed by zeroing some of the values around the estimated position of the blocking signal.

8. A method as defined in any one of claims 1–3 or 5–7 wherein the signal has I and Q signal components and prior to performing step (b), it is determined if the DC-offset estimate is similar for both the I and Q signal components, and if so, the average of the I and Q signal components is calculated and used when performing step (b).

9. A method as defined in claim 8, wherein if the I and Q signal components are not similar, then both signals are filtered and step (b) is performed for both signal components separately.

10. A method as defined in claim 9, wherein both the I and Q signal components are filtered using a sliding average window having a predetermined size prior to performing step (b).

* * * * *

UNITED STATES PATENT AND TRADEMARK OFFICE
CERTIFICATE OF CORRECTION

PATENT NO. : 6,947,496 B2  Page 1 of 1
DATED : September 20, 2005
INVENTOR(S) : Angel Ezquerra-Moreu and Pascal Audinot It is certified that error appears in the above-identified patent and that said Letters Patent is hereby corrected as shown below:

<u>Title page,</u>
Insert Item -- [73] Assignee: Texas Instruments Incorporated, Dallas, Texas (US) --.

Signed and Sealed this

Fourth Day of April, 2006

JON W. DUDAS
*Director of the United States Patent and Trademark Office*